United States Patent
Oklobdzija

(10) Patent No.: US 11,411,553 B1
(45) Date of Patent: Aug. 9, 2022

(54) SYSTEM OF FREE RUNNING OSCILLATORS FOR DIGITAL SYSTEM CLOCKING IMMUNE TO PROCESS, VOLTAGE AND TEMPERATURE (PVT) VARIATIONS

(71) Applicant: Alliacense Limited, LLC, Discovery Bay, CA (US)

(72) Inventor: Vojin G. Oklobdzija, Berkeley, CA (US)

( * ) Notice: Subject to any disclaimer, the term of this patent is extended or adjusted under 35 U.S.C. 154(b) by 0 days.

(21) Appl. No.: 16/900,663

(22) Filed: Jun. 12, 2020

Related U.S. Application Data

(63) Continuation of application No. 15/939,181, filed on Mar. 28, 2018, now Pat. No. 10,707,839.

(60) Provisional application No. 62/477,865, filed on Mar. 28, 2017.

(51) Int. Cl.
  *H03K 3/011* (2006.01)
  *H03B 5/24* (2006.01)
  *H03L 1/02* (2006.01)
  *H03L 7/06* (2006.01)

(52) U.S. Cl.
  CPC .............. *H03K 3/011* (2013.01); *H03B 5/24* (2013.01); *H03L 1/02* (2013.01); *H03L 7/06* (2013.01)

(58) Field of Classification Search
  CPC .. H03K 3/011; H03B 5/24; H03L 7/06; H03L 1/02
  See application file for complete search history.

(56) References Cited

U.S. PATENT DOCUMENTS

| | | | | |
|---|---|---|---|---|
| 5,592,126 | A * | 1/1997 | Boudewijns | H03K 3/0315 331/172 |
| 10,707,839 | B1 * | 7/2020 | Oklobdzija | H03K 3/0315 |
| 2002/0003452 | A1 * | 1/2002 | Mizuno | H03L 7/0805 331/2 |
| 2002/0063605 | A1 * | 5/2002 | Boerstler | H03K 3/0315 331/57 |
| 2008/0018408 | A1 * | 1/2008 | Boerstler | H03K 5/133 331/57 |
| 2011/0148484 | A1 * | 6/2011 | Kim | H03L 7/099 327/148 |
| 2016/0072514 | A1 * | 3/2016 | Tsai | H03B 27/00 331/47 |

* cited by examiner

*Primary Examiner* — Jeffrey M Shin
(74) *Attorney, Agent, or Firm* — Lany E. Henneman, Jr.; Henneman & Associates, PLC

(57) ABSTRACT

A system of free running oscillators synchronized to the lowest frequency running one and following PVT variation generates a system clock. A method is particularly applicable to clock relatively small clock domains within a multi-core chip containing thousands of cores, and where the clock domain encompasses one or more cores and additional logic blocks. The resulting system clock is divided by $2^k$ using latches or flip-flops to achieve a symmetric 50-50 duty cycle of the system clock. Further, such PVT insensitive system clock can be used as a reference for a PLL or DLL generated clock for the domain.

15 Claims, 12 Drawing Sheets

SYSTEM OF FREE RUNNING OSCILLATORS FOR DIGITAL SYSTEM CLOCKING IMMUNE TO PROCESS, VOLTAGE AND TEMPERATURE (PVT) VARIATIONS

RELATED APPLICATIONS

This application is a continuation of co-pending U.S. application Ser. No. 15/939,181, filed on Mar. 28, 2018 by the same inventor, which claims the benefit of U.S. Provisional Patent Application No. 62/477,865, filed on Mar. 28, 2017 by the same inventor, each of which is incorporated herein by reference in its entirety.

BACKGROUND OF THE INVENTION

Field of the Invention

This invention relates generally to clocking digital systems with oscillators, and more particularly to free running oscillators immune to process, voltage, and temperature (PVT) variations.

Description of the Background Art

One of the problems encountered in integrated circuit (IC) design and fabrication is how to deal with variations. Let's suppose that the IC, or "chip" for short, is designed to operate at 5 GHz clock frequency under normal operating conditions—usually referred as TT corner—or nominal conditions. That would mean e.g. operating temperature of 27 degree Celsius, operating voltage of e.g. 1V and nominal processing parameters. However, chip may be exposed to operate under different operating conditions, e.g. The operating temperature may raise up to 105 degree Celsius, the operating voltage may drop to 0.8V instead of 1.0V, and the process parameters may change and produce a "slower" chip, i.e. the one that would fail to operate at 10 GHz, but operate correctly at, e.g. 3 GHz or below. Those variations in operating conditions are referred as: Process, Voltage, and Temperature variations (PVT). In order to assure that the chip coming out of the fabrication will operate in the field, we have to account for the worst possible of the three PVT conditions and assure that the chip will still function correctly. For example, we would design the chip to operate at 10 GHz operating frequency, so that under the worst PVT, the chips will still function at 5 GHz and not fail in the field. This has been known in the integrated circuit design and fabrication field since the beginning, and various computer tools were developed to simulate the IC operation under the worst possible conditions (Worst Corner), in order to assure that the majority of the chips coming out of fabrication will satisfy their operating requirements. Some chips will encounter those conditions and be better than expected. For example, they will come out of the fabrication line operating faster, encounter lower temperature (usually lower temperature results in faster operation), or encounter higher voltage (which has the same effect as lower temperature). The "speeds" (operating frequencies) of the chips coming out of the fabrication line follow a Gaussian like distribution. Some of the chips will operate at higher frequencies than expected and those that fail to operate at 5 GHz and above (e.g.) must be discarded.

Traditionally the operation of the chip (ICs) has been directed by the central clock, which dictates the operating frequency of the chip. The clock is distributed through the chip on a grid or in a tree like fashion. The operation is synchronized with the clock signal, which is referred to as a synchronous operation, i.e. it is said that the chip operates "synchronously", see Uehara, K et al. A Study of an Infrastructure for Research and Development of Many-Core Processors, UPDAS-201. The difference of the frequency for which we need to design the chip operating under nominal/typical conditions and the frequency for which we guarantee the chip operation under worst case is called "margin"—in this case 10 GHz vs. 5 GHz. In terms of the clock period it is 100 pS vs 200 pS—every operation in the chip has to finish in 100 pS, but we have given it an extra 100 pS "margin" in case the worst of the possible conditions are encountered. (Analogy to that would be if it takes 30 minutes to drive from A to B, and one would leave 1 hour earlier just counting that there could be a traffic jam or an accident on the road.)

There are two scenarios which make this problem bad today and even worse in the future:

(a) As the technology scales into smaller geometries e.g. 16 nm, 7 nm today and even 5 nm and 3 nm in the future, the margins are taking 30-50% of the available clock period. Therefore, we are wasting half of the available time, just in case worst conditions are encountered.

(b) As the trend in chip design is to use more of the processor "cores" (core being a processor unit), the number of processors on the chip is reaching hundreds and even thousands of processors in the future: e.g. 2,048, 4,096 or more.

(c) Recently, devices are starting to exhibit change of parameters over time (e.g., during the life span of the chip the performance may slow down). This is referred to as aging effects. Thus, additional margining is necessary to overcome aging effects.

It is becoming difficult to clock thousands of processors on the silicon die all in a synchronous fashion and all with increasing process variations, or the margins are becoming big.

Process Variations

Fabrication process variations can be further categorized into several categories:

(a) There are differences between different batches of silicon wafers being processed at the same fabrication facility. Those are referred to as "batch-to-batch" or "run-to-run" variations.

(b) Within each "run" there are variations between silicon wafers, referred to as "wafer-to-wafer" variations.

(c) Each silicon wafer contains hundreds of "chips" or "dies" and they come out differently. Those variations are referred to as "die-to-die" or "chip-to-chip" variations.

(d) Within each silicon die (chip) there are different areas of the chip that are receiving different exposure during the fabrication process, and different areas of the chip will exhibit different characteristics. Those are referred as "intra-die" variations.

We have seen many attempts in the past to design chips that will operate in "asynchronous" instead of "synchronous" fashion, with claims that "asynchronous" design can overcome all the problems listed here. However, all those attempts failed to produce competitive or workable/credible results.

In June of 1995 Charles Moore filed for a patent application which was issued on Sep. 15, 1998 as U.S. Pat. No. 5,809,336, known as the '336 patent. This patent describes a single ring oscillator clocking the processor, while the processor is communicating with the outside of the chip components synchronously under a control of a crystal clock. One of the drawbacks of this patent is that if the ring oscillator happens to be in the part of the chip least affected by PVT, the parts of the chip, which are in regions of the chip affected by PVT will fail to operate.

An object of the present invention is to provide a flexible, yet synchronous/asynchronous clocking system that will adapt to the changing situation due to the PVT variations.

SUMMARY

This invention provides a system of free running oscillators (FROs) that are adopting to the PVT variations and providing the clock signal to provide synchronization within an entire chip, or more specifically within a core or clock domain (one of many) on the chip. The free running oscillators can be implemented as ring oscillators or any other implementation that follows PVT variations in frequency. Ring oscillator is one of many possible implementations of the FRO, and it is used for purposes of example throughout this disclosure. In the actual implementation, it is suggested that the utilized FROs are made of the same logic blocks that exist in the critical path of the design, i.e. the critical paths should be replicated with output tied to the input providing free running oscillations. Such an FRO has the closest behavior to the critical path in tracking PVT effects on the elements contained within the boundaries of the core.

Further, the resulting clock signal is always running at the lowest frequency of all frequencies provided by free running oscillators. That means that the core or clock domain within the chip is clocked at the frequency determined by the worst PVT region within the chip. The term "clock domain" designates the region of the chip (single or multiple cores) that is being clocked by the described arrangement. The resulting clock signal will be designated as the "system clock".

BRIEF DESCRIPTION OF THE DRAWINGS

The present invention is described with reference to the following drawings, wherein like reference numbers denote substantially similar elements.

DETAILED DESCRIPTION

The present invention overcomes problems associated with the prior art. In the following description, numerous specific details are set forth in order to provide a thorough understanding of the invention. Those skilled in the art will recognize, however, that the invention may be practiced apart from these specific details. In other instances, details of well-known clocking practices and components have been omitted, so as not to unnecessarily obscure the present invention.

The following references are incorporated herein by reference:

1. V. G. Oklobdzij a, et al, Digital System Clocking: High Performance and Low-Power Aspects, Wiley-IEEE, (2005); and
2. V. G. Oklobdzij a, "Clocking and Clocked Storage Elements in a Multi-Gigahertz Environment," IBM Journal of Research and Development, (2003), vol. 47, no. 5/6, pp. 567-584.

Figure 1:
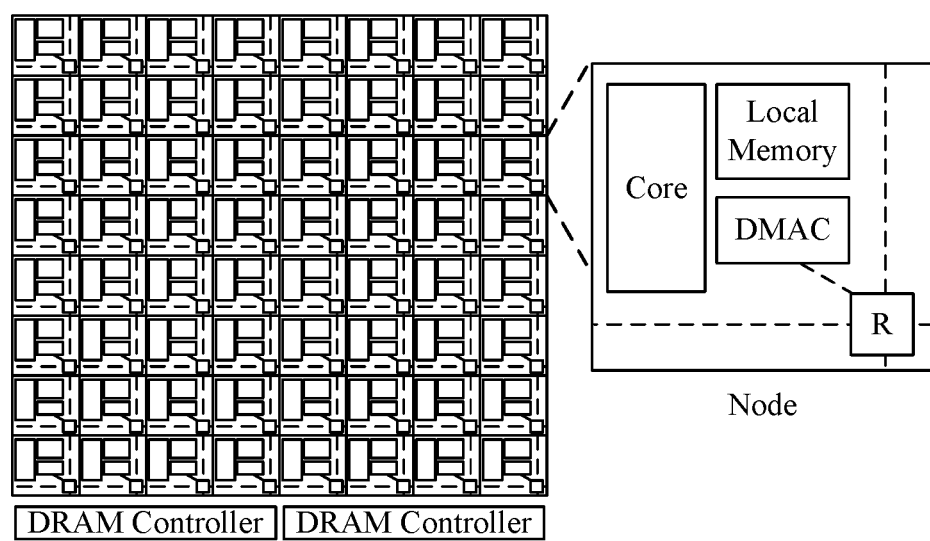
FIG. 1 shows a silicon chip divided into multiplicity of clock domains.

FIG. 1 shows the silicon chip divided into a multiplicity of clock domains that could be cores or regions containing more than a single core. An example of such a system is taken from the open literature (Uehara).

FIG. 1 also shows an example of a clock domain, in this case consisting of one, local memory, DMAC and associated Router. The example is taken from the open literature (Uehara).

Figure 2:
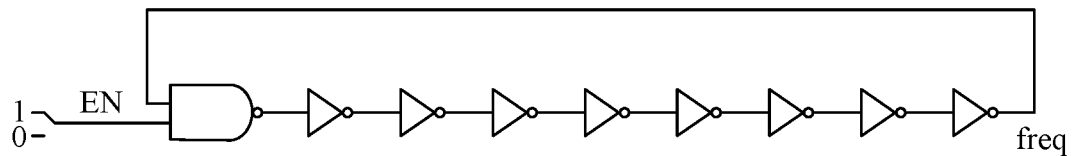
FIG. 2 shows a free running oscillator (FRO)

FIG. 2 shows a free running oscillator (FRO) (implemented as a ring oscillator in this case). The operation of the ring oscillator is controlled by the Enable signal (EN). When EN=0 the ring oscillator is not oscillating and it is in a predetermined known state. When EN=1, the ring oscillator is oscillating at the frequency determined by the delay of the elements in its path (invertors in shown case), which is dependent on PVT.

Figure 3A:
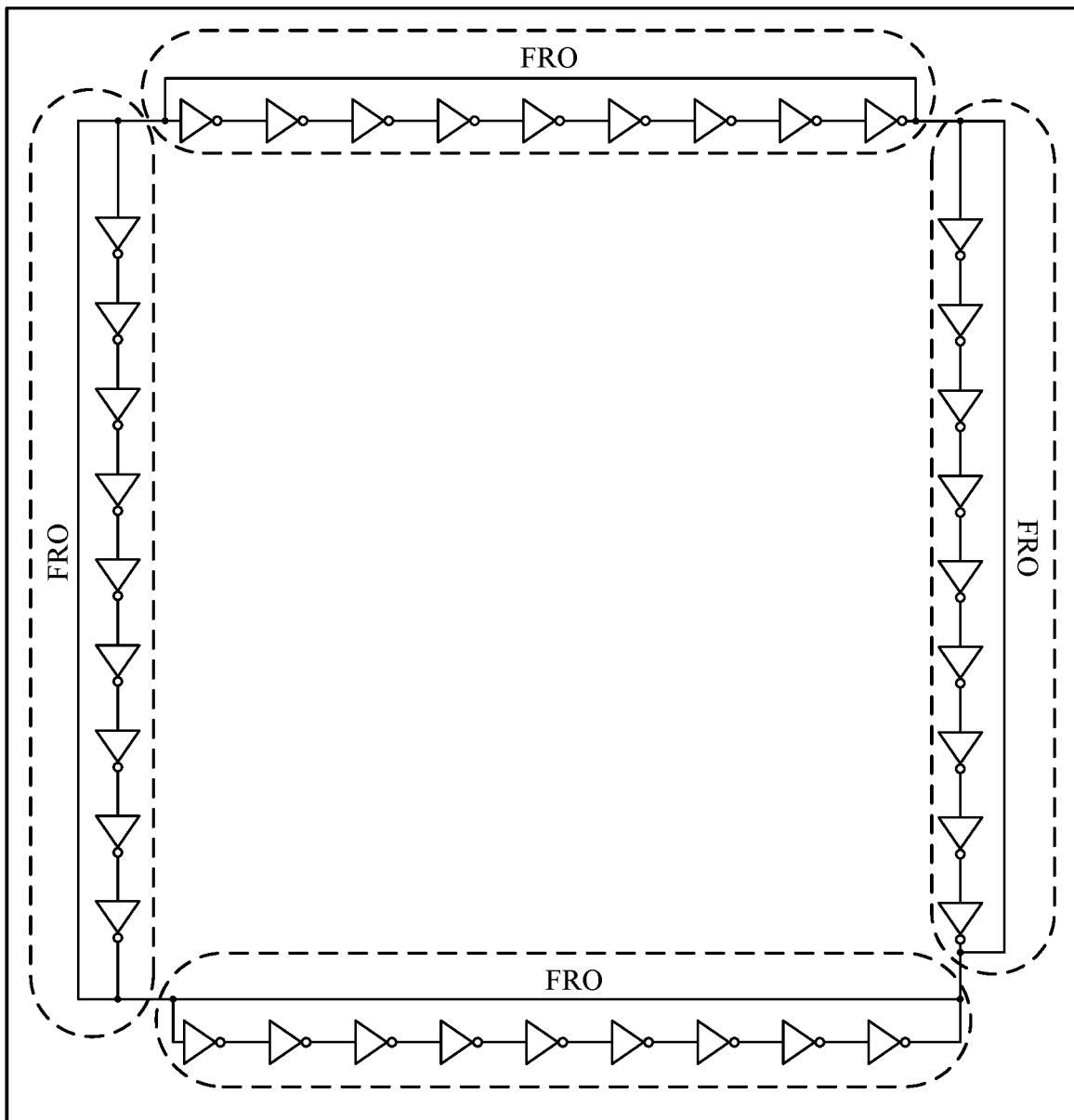
FIG. 3A shows an example of multiple FROs.

FIG. 3A shows an example of free running oscillators, elements of which are dispersed across the clock domain (in this particular case, around the boundary of the domain). The FROs are interconnected via a grid, which forces the FROs to synchronize to the average frequency and PVT conditions. The grid is further interconnected into a well-known "clock mesh" for distributing the system clock within the domain.

Figure 3B:
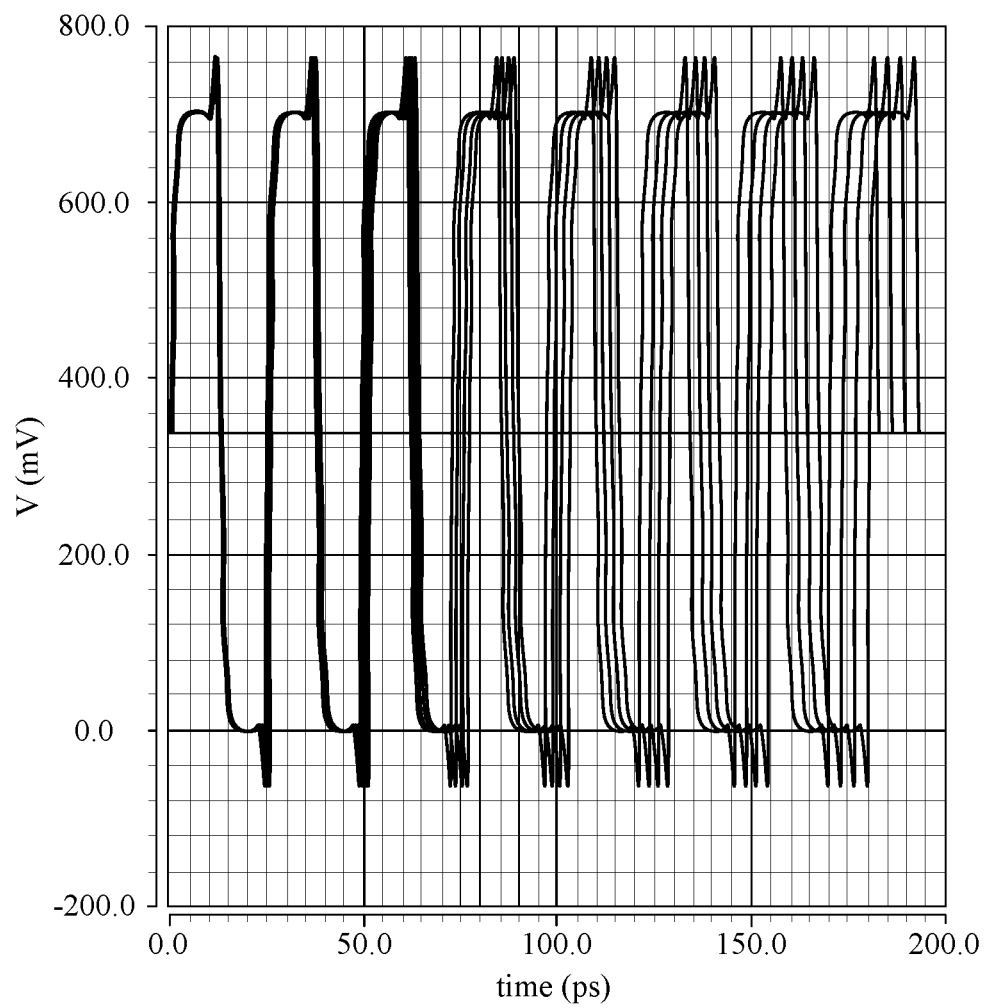
FIG. 3B shows simulation results of an experiment conducted using Cadence CAD simulation tool on the FROs shown in FIG. 3A disconnected from one another.
Figure 3C:
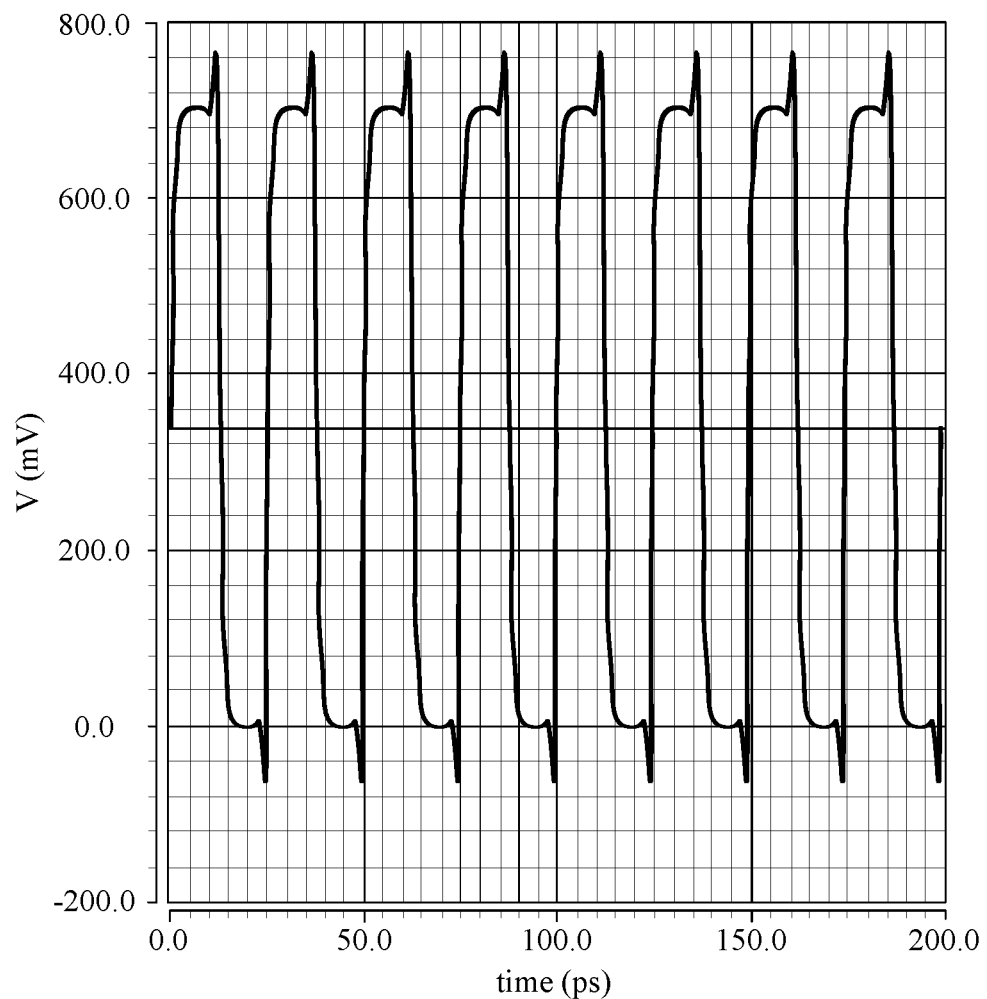
FIG. 3C also shows simulation results of an experiment conducted using Cadence CAD simulation tool on the structure (connected FROs) shown in FIG. 3A.

FIGS. 3B and 3C show simulation results of an experiment conducted using the Cadence CAD simulation tool on the structure shown in FIG. 3A. FIG. 3B shows the signal waveform of four free running oscillators (from FIG. 3A) when they are not connected via grid (i.e. the grid is disconnected). The FROs are running at their own frequencies (they are intentionally made to be different to simulate process variations).

FIG. 3C shows their signals when they are connected via the grid. FIG. 3C shows how the signals are perfectly synchronized to each other and can be used as the system clock, which has a frequency that varies with PVT.

Figure 4A:
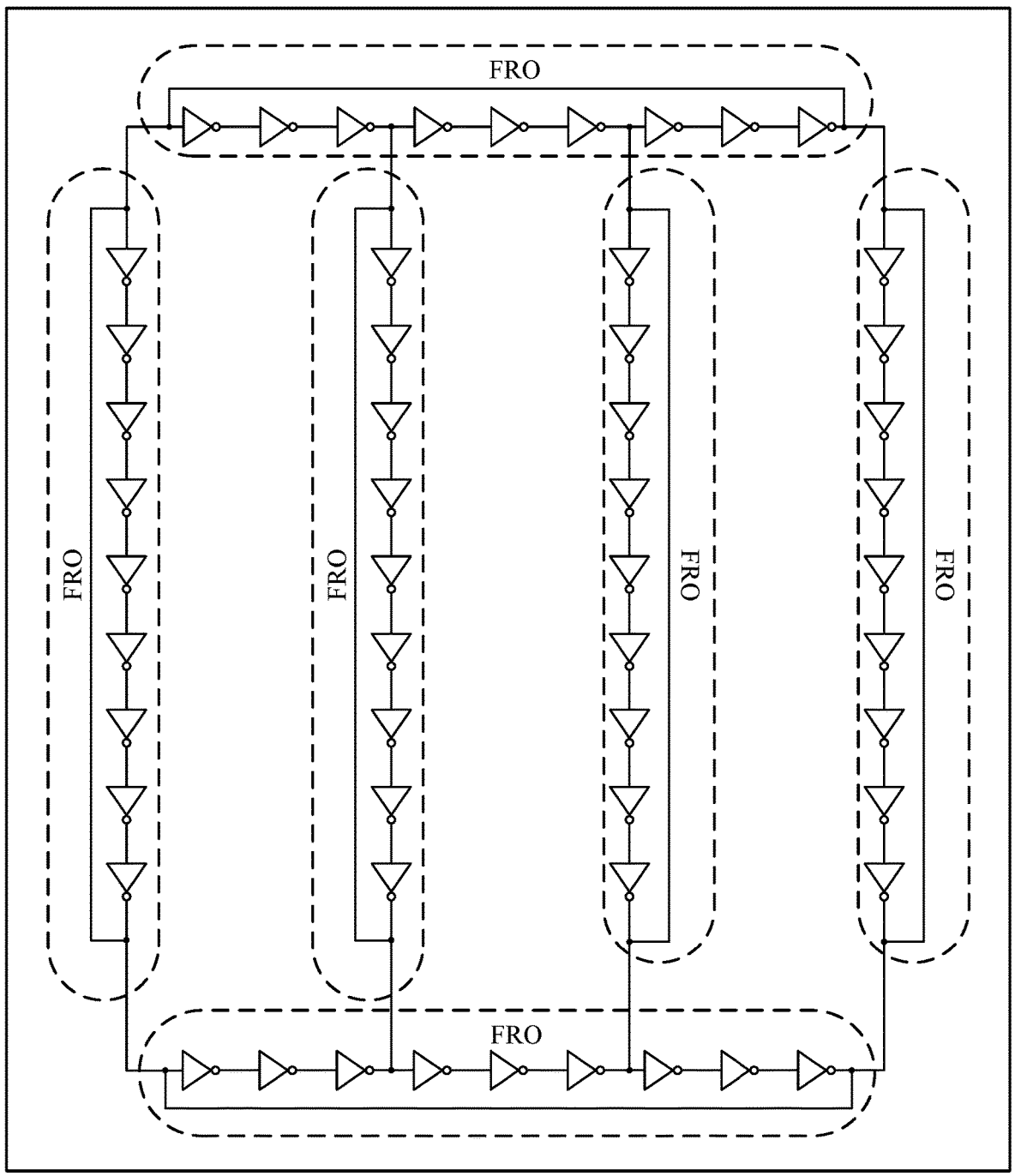
FIG. 4A shows another topology of a system of FROs.
Figure 4B:
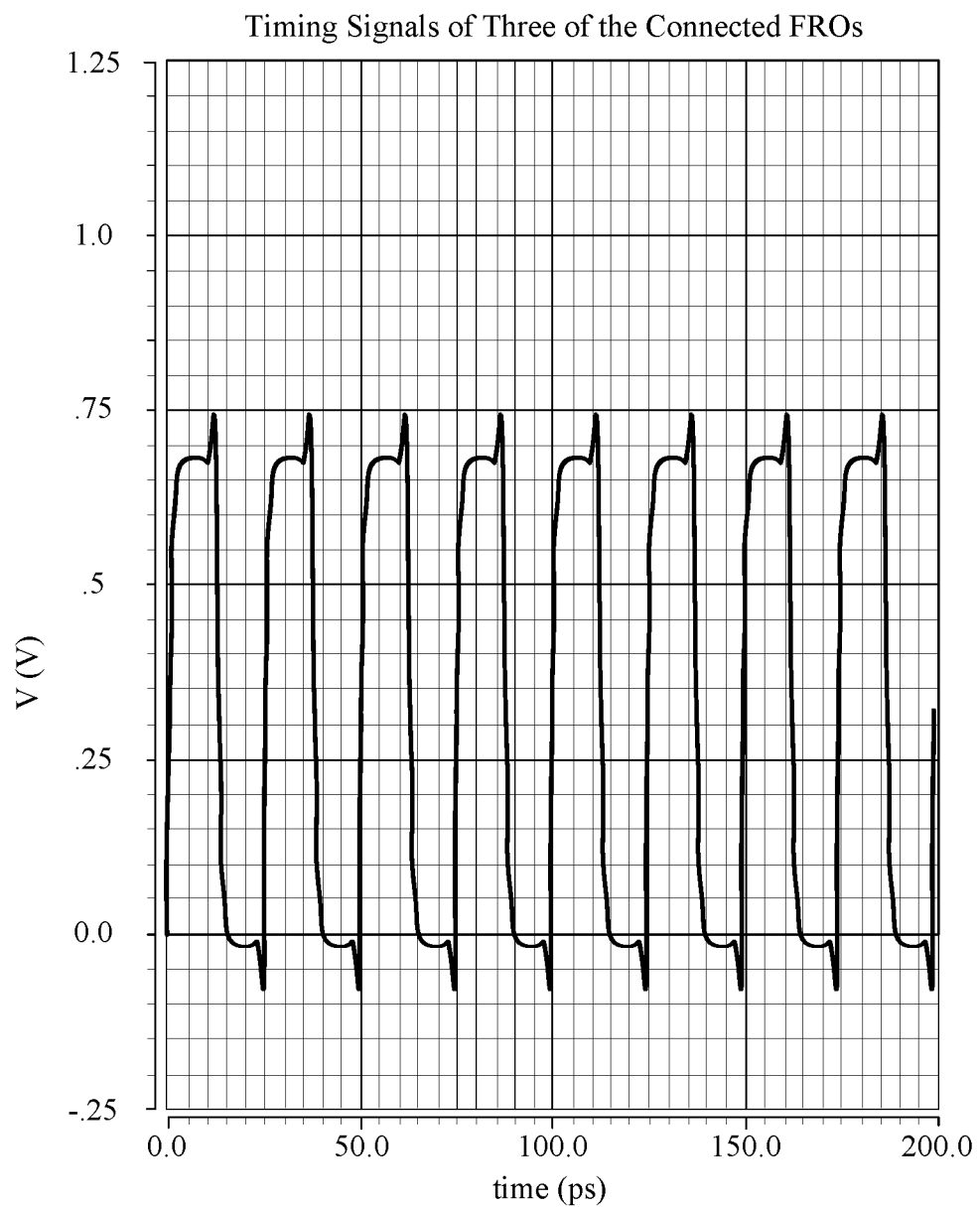
FIG. 4B shows the clock signals originating from three of the FROs shown in the structure of FIG. 4A.
Figure 4C:
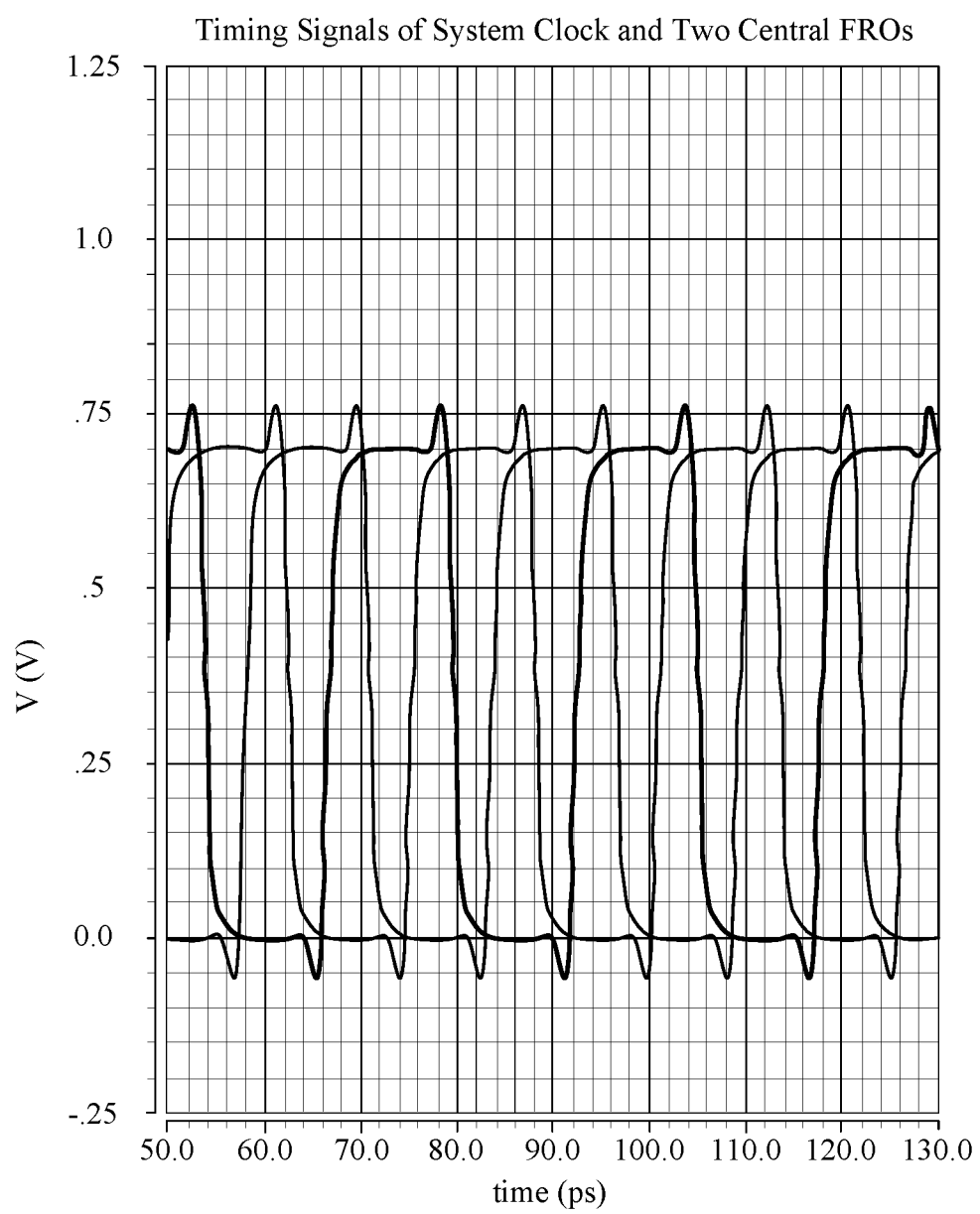
FIG. 4C shows clocking signals from the main system clock (emphasized) and two signals from the two FROs in the middle of the domain.

FIG. 4A shows another topology of the system of FROs dispersed throughout the clock domain in a way that can capture all the areas of the domain and associated PVT variations. FROs are interconnected at various points, forcing them to synchronize. Though FIG. 4A shows six FROs synchronized together, the number of FROs utilized in such a configuration is not limited to six and can include many more FROs. FIG. 4B shows the clock signals originating from three of the FROs shown in the structure described in FIG. 4A. We can observe how they are perfectly synchronized generating the system clock. FIG. 4C shows the main system clock (emphasized) and two signals from the two FROs in the middle of the domain. The experiment shown in FIGS. 4A-4C demonstrates that the system described is operational.

Figure 5A:
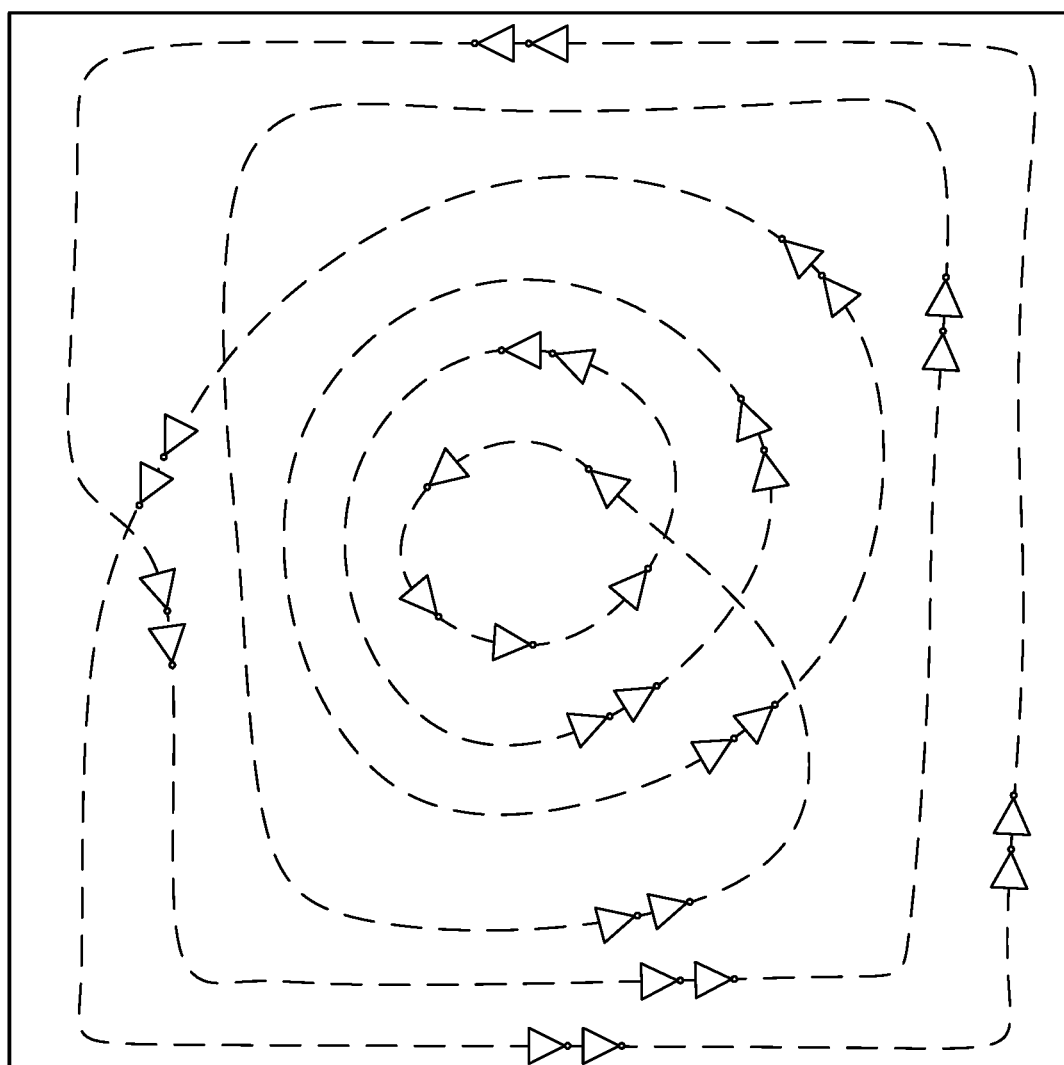
FIG. 5A shows a possible topology for placing FROs within the domain.
Figure 5B:
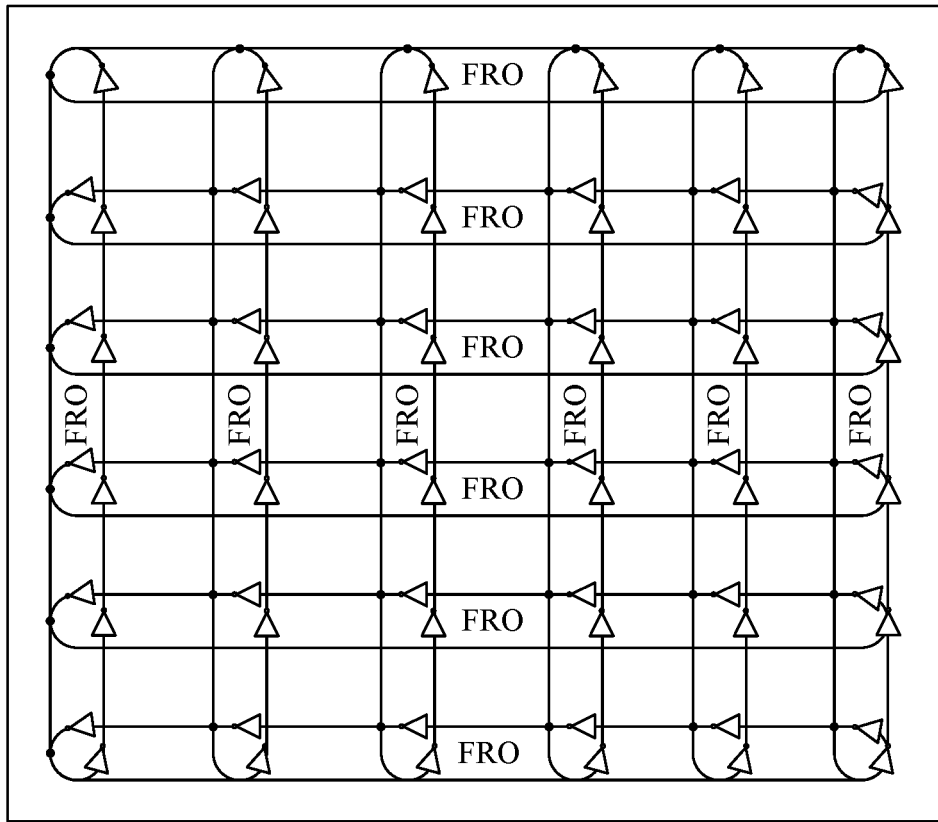
FIG. 5B shows another possible topology for placing FROs within the domain.

FIG. 5A shows another possible topology for placing FROs within the domain. The invention described in FIGS. 1-5B shows a system of free running oscillators that is synchronized by the application of a grid. (i.e. by tying all the FROs outputs together) The clock signal in this case runs at the frequency that represents an average frequency of FROs in the system, and the frequency follows PVT variations in the domain. When using such an arrangement in a design, timing of the critical path still has to allow for a small margin, which is due to the process parameter variation across various points of the domain, though, such a margin is considerably smaller than the margin used across the entire chip (die). However, this invention will alleviate all other variations, aging effects included.

Figure 6:
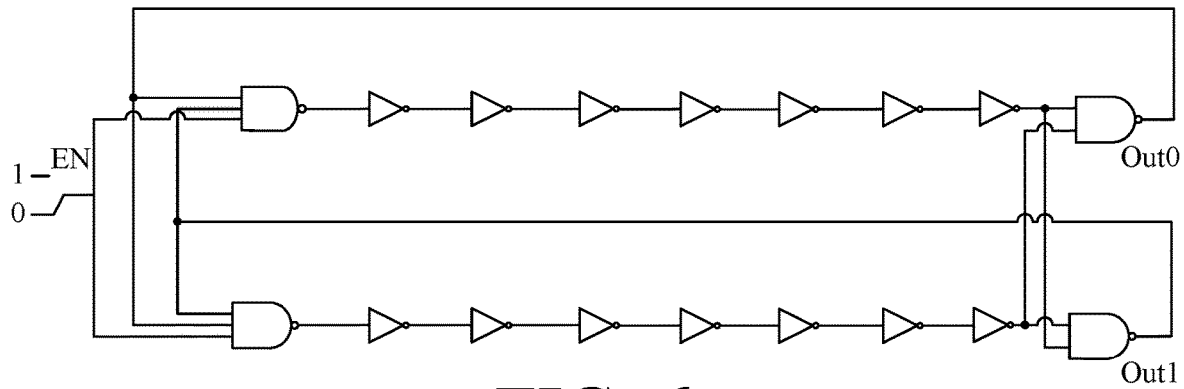
FIG. 6 shows two FROs that are linked with each other.
Figure 7:
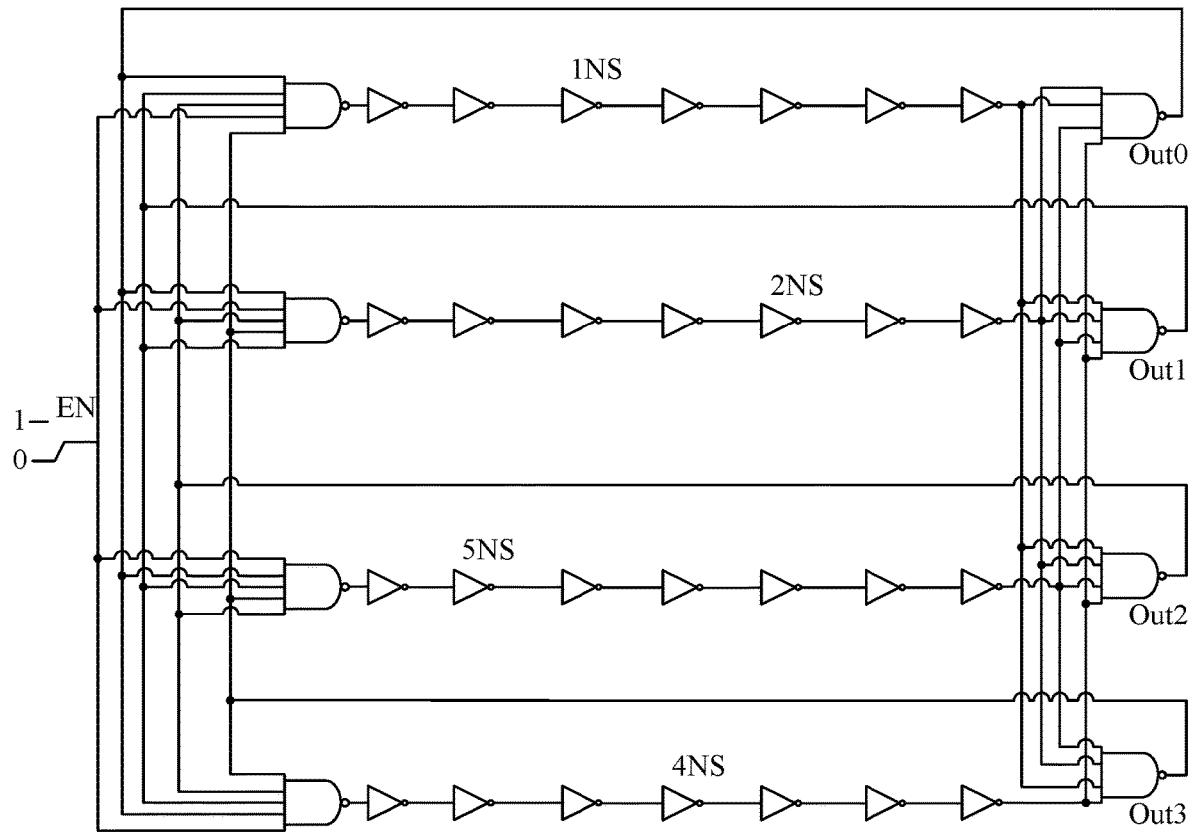
FIG. 7 shows an arrangement of four oscillators in a domain.

The systems described here force the resulting system clock to run at the lowest frequency of all the FROs within the clock domain. This operation is illustrated in the example of two FROs synchronized to run at the lower frequency of the two, as shown in FIG. 6. FIG. 6 illustrates two FROs that are linked with each other in such a way that the frequency of the slower of the two FRO dominates. The number of FROs that can be synchronized to the frequency of the lowest is not limited to two FROs, and we can use as many as practicably feasible and sufficient for achieving our goal. FIG. 7 illustrates an arrangement of four such oscillators in a domain, producing the system clock running at the lowest frequency attainable due to PVT in the domain.

In all the instances described, FROs are controlled by an Enable signal (EN). When EN=0 FROs are prevented from oscillating. When EN=1, the FROs are enabled to oscillate. Further, as EN is a common signal to all of them, it provides a determined starting point for all of the FROs, thus any "races" to synchronize with each other are avoided. Additional Enable signals can be used to turn off particular regions of the chip (clock gating).

Figure 8:
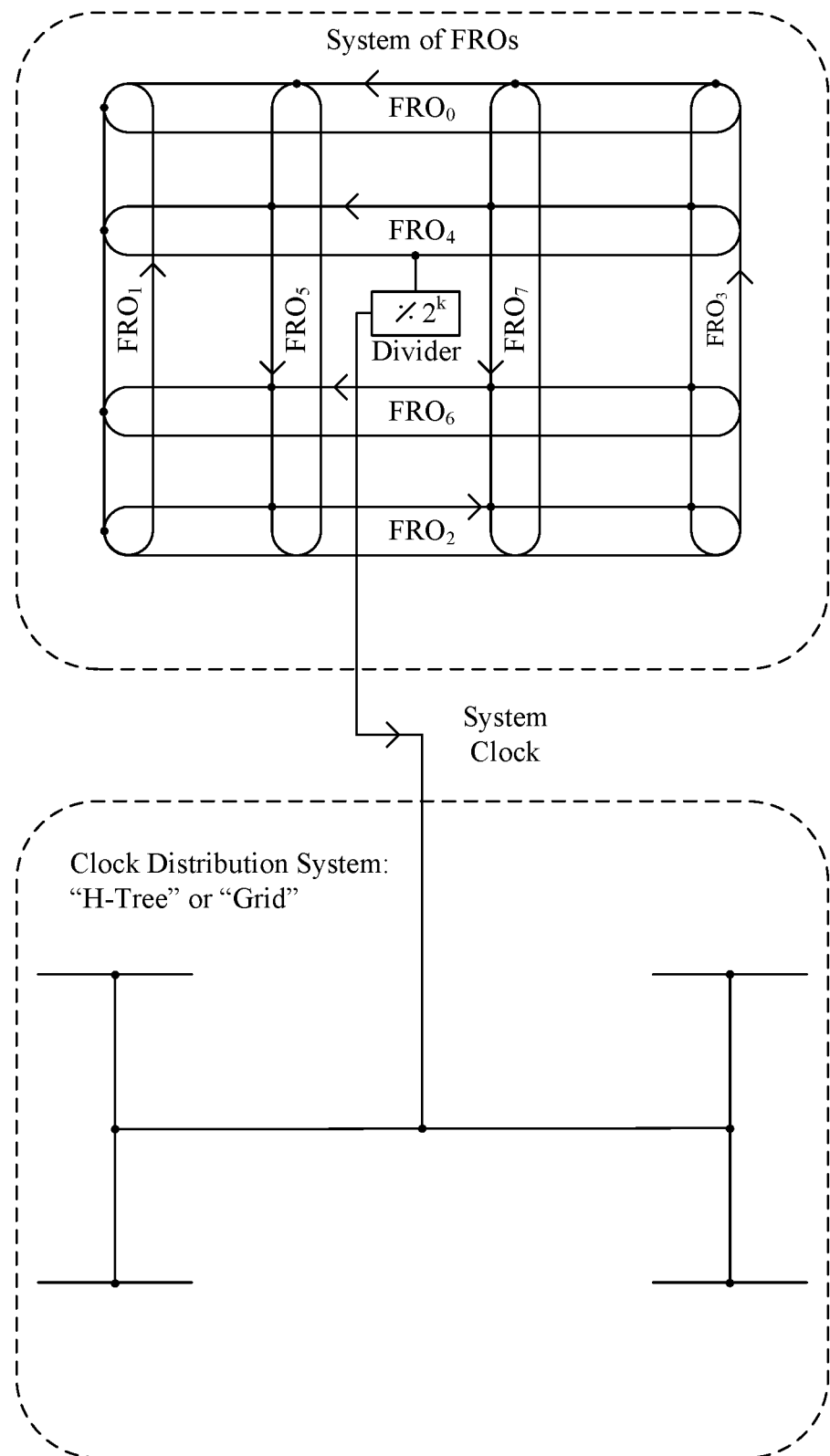
FIG. 8 shows a system that generates a system clock with near perfect 50-50 clock duty cycle.

The resulting signal of the system of FROs shown in FIG. 6 (running at the frequency dictated by the slowest FRO in the system) does not produce a "symmetric" clock signal, i.e. the clock signal with the 50-50 "duty cycle". When this feature is desired and necessary, the system of FROs is set to run at the frequency that is twice or four times as fast as the desired system clock frequency. The desired frequency is obtained by dividing the clock signal by the factor of 2 or 4 (or factor $2^k$ in general). This generates the system clock with near perfect 50-50 clock duty cycle. This is illustrated in FIG. 8.

Figure 9:
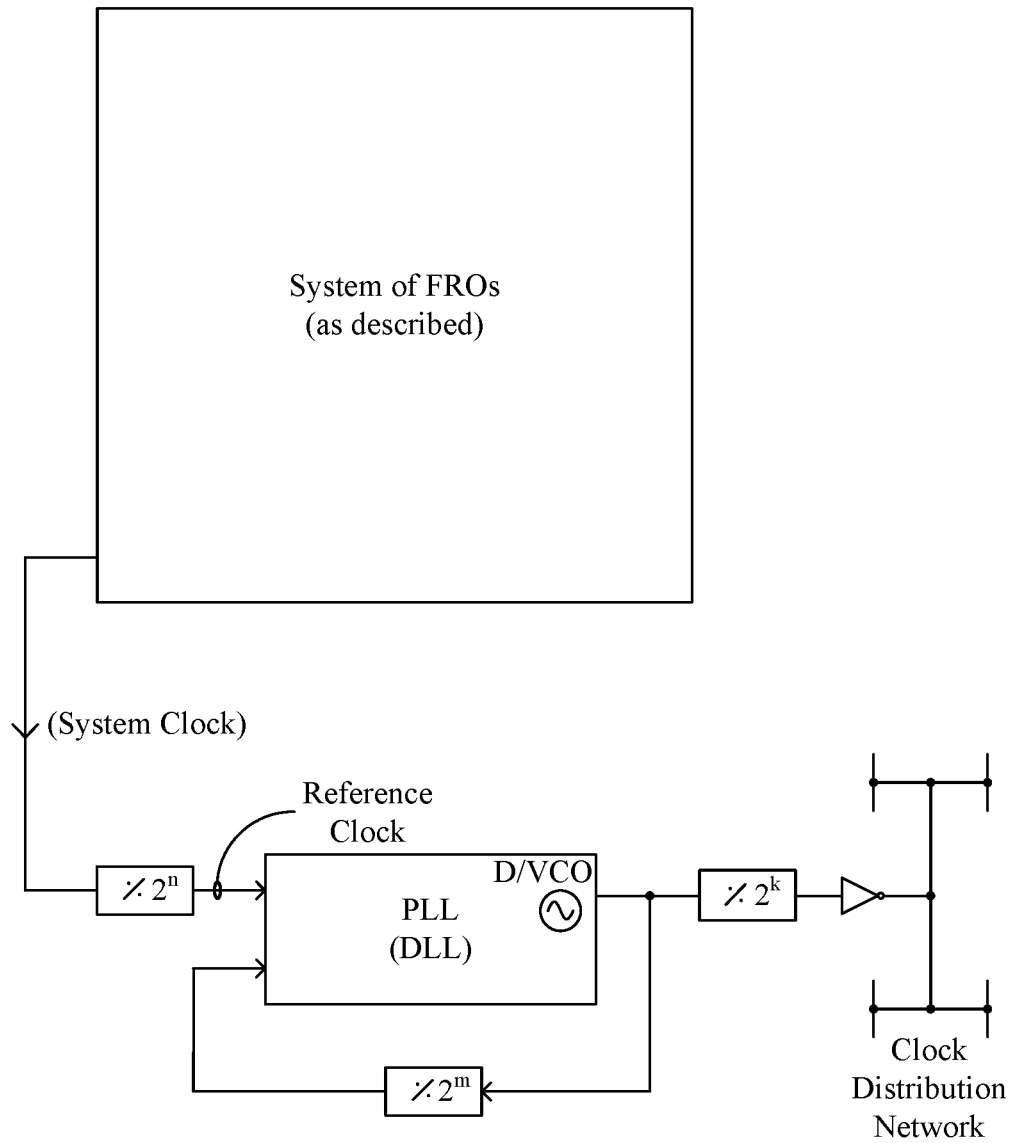
FIG. 9 shows a system of FROs that provide a reference point for phase locked loop (PLL) or digital locked loop (DLL) clocking in a domain.

It is further possible to use a described system of FROs to provide a reference point for PLL or DLL in the domain. Thus, the system can follow standard design flow, using PLL or DLL, while the reference clock provides a signal that follows PVT. The PLL or DLL can then provide the system clock signal that is following the reference signal by a factor introduced by PLL/DLL. This arrangement is illustrated in FIG. 9. Communication between domains (e.g. cores) is performed in asynchronous fashion since each domain is clocked synchronously by its own system clock independent of each other.

The description of particular embodiments of the present invention is now complete. Many of the described features may be substituted, altered or omitted without departing from the scope of the invention. Various deviations from the particular embodiments shown will be apparent to those skilled in the art, particularly in view of the foregoing disclosure.

I claim:

1. A system of free running oscillators (FROs) whose frequency is determined by process, voltage, and temperature variations (PVT), running in synchrony with each other providing a composite system clock, said system comprising:
   a first FRO disposed at a first location on an integrated circuit chip, said first FRO including a first type of logic blocks;
   a second FRO disposed at a second location on said integrated circuit chip, said second FRO including a second type of logic blocks, said first FRO and said second FRO being synchronized by being interconnected;
   a plurality of nodes, each node including local memory, a core, and a third type of logic blocks;
   a clock signal generating circuit coupled to receive a reference clock signal from said system of free running oscillators, to generate a composite system clock signal based on said reference clock signal, and to provide said composite system clock signal to said nodes; and
   wherein
   said first type of logic blocks, said second type of logic blocks, and said third type of logic blocks are all the same.

2. The system of claim 1 additionally including a clock grid.

3. The system of free running oscillators of claim 1, wherein said composite system clock runs at the lowest frequency of FROs in the system.

4. The system of claim 2, wherein said reference clock signal is provided to a phase-locked loop (PLL) clocking a particular clock domain.

5. The system of claim 2, wherein said reference clock signal is provided to a delay-locked loop (DLL) clocking a particular clock domain.

6. The system of claim 2, wherein a frequency of said reference clock signal is divided by a factor of $2^k$ to produce 50-50 clock duty cycle.

7. An apparatus comprising:
   an integrated circuit substrate providing different circuit speeds depending on location on the substrate;
   an integrated circuit comprising a plurality of circuits formed in said integrated circuit substrate and spanning a defined area of said integrated circuit substrate, said circuits including logic gates of a first type;
   a plurality of ring oscillators formed in said defined area of said integrated circuit at different locations; said ring oscillators connected to each other and including logic gates of said first type;
   a clock distribution system connected to said plurality of circuits of said integrated circuit; and
   said plurality of ring oscillators connected to said clock distribution system.

8. The apparatus according to claim 7, wherein the plurality of ring oscillators are interconnected to provide a clock speed at the interconnection to said clock distribution system which is an average of the speed of said plurality ring oscillators.

9. The apparatus according to claim 7, wherein the plurality ring oscillators are interconnected to provide a clock speed at the interconnection to said clock distribution system which is the lowest speed of said plurality ring oscillators.

10. The apparatus according to claim 7, wherein the plurality ring oscillators are spaced and arranged within said defined area of said integrated circuit substrate in a pattern such that each ring oscillator substantially spans the defined area.

11. The apparatus according to claim 10, wherein the pattern is interleaved.

12. The apparatus according to claim 10, wherein the pattern is a spiral.

13. The apparatus according to claim 9, wherein each of the plurality of ring oscillators comprises an odd number of inverters wherein the first and last inverters of each of the plurality ring oscillators are NAND gates.

14. The apparatus according to claim 13, wherein the first NAND gate of each of the ring oscillators has at least one input connected to the output of another of said plurality of ring oscillators.

15. The apparatus according to claim 13, wherein the last NAND gate of each of the plurality ring oscillators has at least one input connected to the second to last inverter of another ring oscillator of said plurality of ring oscillators.

\* \* \* \* \*